United States Patent
Kao et al.

(10) Patent No.: US 11,442,116 B2
(45) Date of Patent: Sep. 13, 2022

(54) DETECTION CIRCUIT AND METHOD OF DETECTING ILLEGAL REMOVAL THEREOF

(71) Applicant: Wiwynn Corporation, New Taipei (TW)

(72) Inventors: Yu Shu Kao, New Taipei (TW); Hsuan-Chih Kao, New Taipei (TW); Yueh-Chi Lee, New Taipei (TW); Yun-Chih Tsai, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 44 days.

(21) Appl. No.: 17/135,966

(22) Filed: Dec. 28, 2020

(65) Prior Publication Data

US 2022/0155385 A1     May 19, 2022

(30) Foreign Application Priority Data

Nov. 13, 2020 (TW) ................................ 109139627

(51) Int. Cl.
*G01R 31/66* (2020.01)
(52) U.S. Cl.
CPC ................................... *G01R 31/66* (2020.01)
(58) Field of Classification Search
CPC ..................................................... G01R 31/66
See application file for complete search history.

(56) References Cited

U.S. PATENT DOCUMENTS

| | | | |
|---|---|---|---|
| 8,255,988 B2* | 8/2012 | Carpenter | G06F 21/575 |
| | | | 726/17 |
| 2007/0089170 A1 | 4/2007 | Chen et al. | |
| 2007/0239990 A1* | 10/2007 | Fruhauf | G06F 21/32 |
| | | | 713/185 |
| 2008/0178275 A1* | 7/2008 | Chung | G06F 21/83 |
| | | | 726/28 |
| 2016/0164725 A1* | 6/2016 | Wu | H04L 12/40 |
| | | | 370/257 |
| 2018/0225230 A1* | 8/2018 | Litichever | G06F 13/107 |

FOREIGN PATENT DOCUMENTS

| | | |
|---|---|---|
| CN | 104361277 | 2/2015 |
| CN | 108777639 | 11/2018 |
| TW | 200715178 | 4/2007 |
| TW | M333610 | 6/2008 |

OTHER PUBLICATIONS

"Office Action of Taiwan Counterpart Application", dated Dec. 15, 2021, p. 1-p. 6.
"Office Action of Taiwan Counterpart Application", dated Sep. 28, 2021, p. 1-p. 6.

* cited by examiner

*Primary Examiner* — Akm Zakaria
(74) *Attorney, Agent, or Firm* — JCIPRNET

(57) ABSTRACT

A detection circuit, including a first connecting terminal, an SPI bus, and a security component, is provided. The first connecting terminal is configured to be detachably connected to the main board. The security component is coupled to the first connecting terminal and the SPI bus. The security component forms a first loop with the main board, and is configured to detect a loop state of the first loop. The security component locks the SPI bus when the first loop is being detected by the security component to be disconnected.

17 Claims, 4 Drawing Sheets

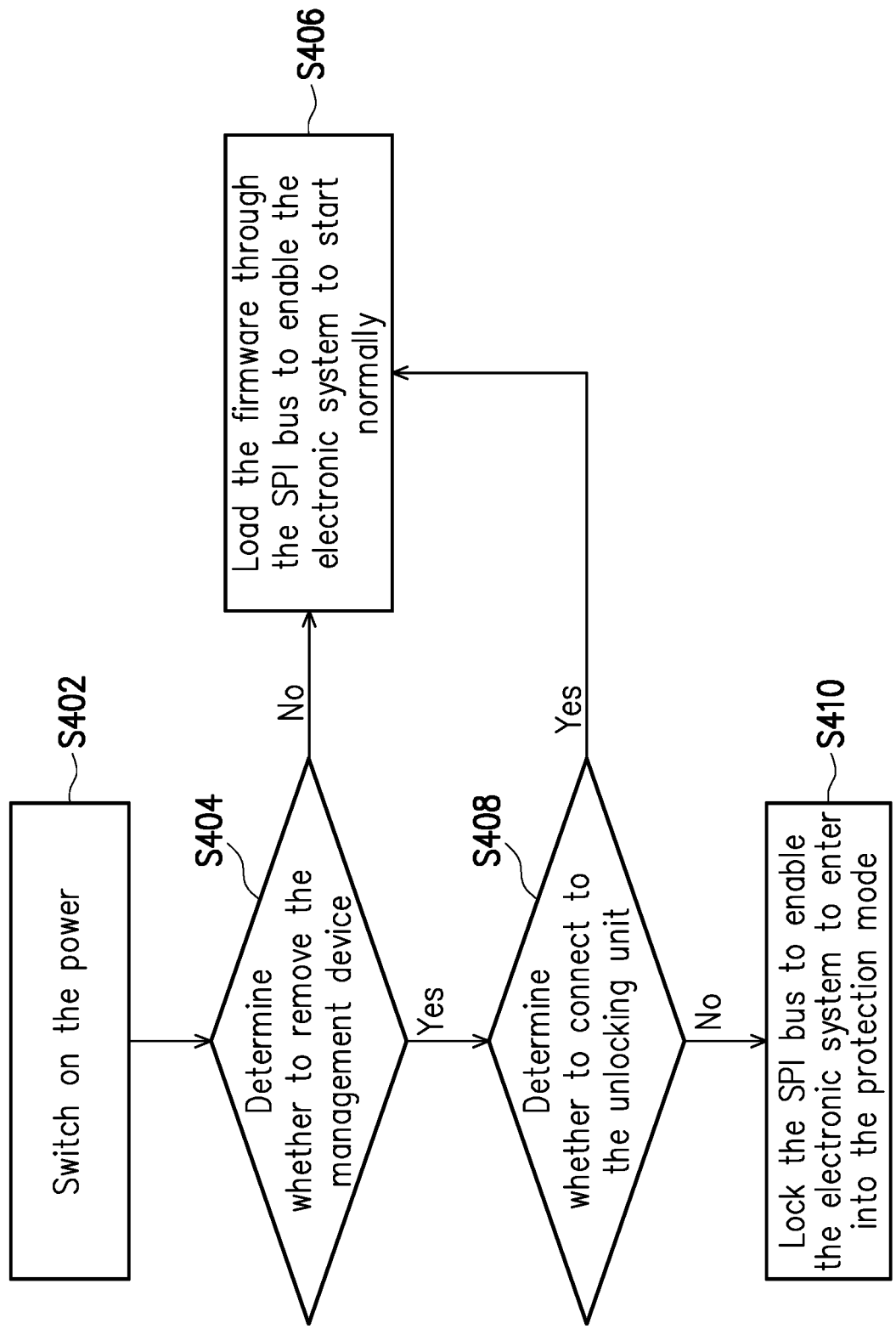

DETECTION CIRCUIT AND METHOD OF DETECTING ILLEGAL REMOVAL THEREOF

CROSS-REFERENCE TO RELATED APPLICATION

This application claims the priority benefit of Taiwan application serial no. 109139627, filed on Nov. 13, 2020. The entirety of the above-mentioned patent application is hereby incorporated by reference herein and made a part of this specification.

BACKGROUND

Technical Field

This disclosure relates to a safe removal of device technology, and in particular to a detection circuit and a method of detecting an illegal removal thereof.

Description of Related Art

With the development of technological trends, current servers are developing towards a modular design in response to highly varied workload requirements. In the modular design of a device, each device has the advantage of being pluggable, and may provide users with the flexibility to configure the required device simultaneously. Conventionally, a server device may include a management device, and the management device may be detachably connected to the main board (host side). However, a disadvantage of this architecture is that when the management device is improperly plugged and unplugged, there may be concerns with regards to system security. Therefore, how to avoid system security problems due to the management device being pulled out in an unexpected state remains a challenge for those skilled in the art.

SUMMARY

This disclosure provides a detection circuit and a method of detecting an illegal removal thereof, which can effectively maintain and protect system security.

The detection circuit according to the embodiment of the disclosure includes a first connecting terminal, an SPI bus, and a security component. The first connecting terminal is configured to be detachably connected to the main board. The security component is coupled to the first connecting terminal and the SPI bus. The security component forms a first loop with the main board, and is configured to detect a loop state of the first loop. The security component locks the SPI bus when the first loop is being detected by the security component to be disconnected.

The method of detecting the illegal removal according to the embodiment of the disclosure is applicable to a detection circuit having a first connecting terminal, an SPI bus, and a security component. The first connecting terminal is configured to be detachably connected to the main board. The security component is coupled to the first connecting terminal and the SPI bus. The method includes the following steps. A loop state of a first loop formed by the first connecting terminal and the main board is detected. The SPI bus is locked when the first loop is being detected to be disconnected.

Based on the above, the embodiment of the disclosure may provide the detection circuit in a management device, and may provide the unlocking component too. In this way, the system security may still be protected even when the management device is illegally removed.

To make the aforementioned more comprehensible, several embodiments accompanied with drawings are described in detail as follows.

BRIEF DESCRIPTION OF THE DRAWINGS

FIG. 4 shows a flowchart of a method of detecting an illegal removal according to an embodiment of the disclosure.

DESCRIPTION OF THE EMBODIMENTS

Figure 1:
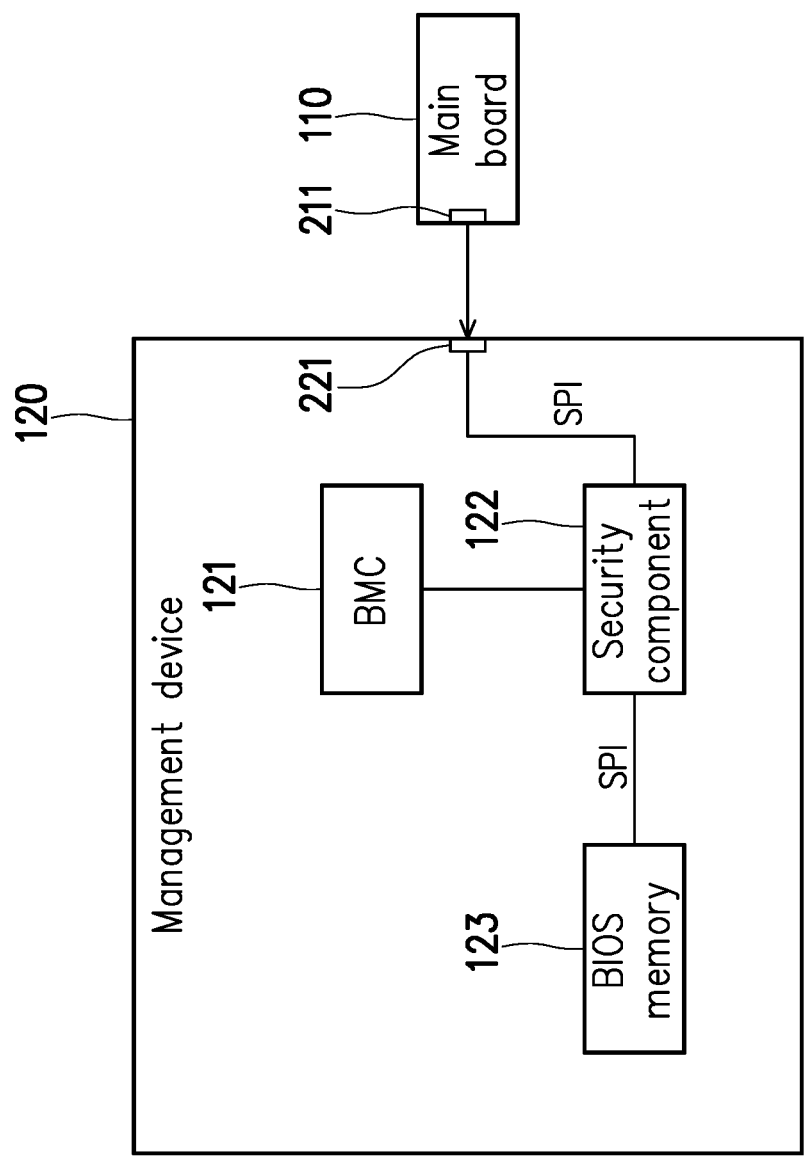
FIG. 1 is a schematic diagram of an electronic system according to an embodiment of the disclosure.

Some embodiments of the disclosure accompanied with drawings are described in detail as follows. The reference numerals in the following description are regarded to represent the same or similar elements when the same reference numeral appears in the different drawings. These embodiments are only a part of the disclosure, and do not disclose all possible implementation manners of the disclosure. More precisely, these embodiments are just examples of the methods and systems of the disclosure that are within the scope of the patent application.

FIG. 1 is a schematic diagram of an electronic system according to an embodiment of the disclosure. With reference to FIG. 1, an electronic system 100 includes a main board 110 and a management device 120. The management device 120 is detachably coupled to the main board 110. The main board 110 includes, for example, a connecting terminal 211. The management device 120 includes, for example, a baseboard management controller (BMC) 121, a security component 122, a basic input/output system (BIOS) memory 123, and a connecting terminal 221. The security component 122 may be, for example, connected to the BMC 121, the BIOS memory 123, and the connecting terminal 221 through a Serial Peripheral Interface (SPI) bus. For example, the electronic system 100 may be a server in a data center, and the like, but the disclosure is not limited thereto.

In the embodiment, the electronic system 100 may include a processor (not shown), and the processor is configured to be responsible for the overall operation of the electronic system 100, including operations such as system startup and booting up. The processor may be connected to the security component 122, and perform data transmission and exchange with one or more peripheral hardware devices connected to the security component 122 through the SPI bus. The processor includes, for example, a central processing unit (CPU), or other programmable general-purpose or special-purpose microprocessors, a digital signal processor (DSP), a programmable controller, an application-specific integrated circuit (ASIC), a programmable logic device (PLD), or other similar devices, or a combination of these devices, but the disclosure is not limited thereto.

In the embodiment, the BMC 121 is a small dedicated processor configured to collect data relating to operating circumstances and a system state of the electronic system 100, such as a system voltage and temperature, and to manage and monitor an operation state and a physical health state of the electronic system 100. In some embodiments, the BMC 121 may also integrate an internal monitoring device, and an input/output interface, a bus, etc., that communicates with an external sensor and an expansion component interface. In addition, the BMC 121 can also be coupled to the BIOS memory 123 to perform BIOS maintenance. The BIOS memory 123 is, for example, a random access memory (RAM), a read-only memory (ROM), a flash memory, a hard disk or other similar devices, or a combination of these devices, and is configured to store BIOS code. The BMC 121 may update a system BIOS and reboot a host system. Those skilled in the art should have a sufficient understanding of the BMC 121, and may implement the BMC 121 according to actual needs. Therefore, more details relating to the BMC 121 are not further described here.

It is worth mentioning that the security component 122 may also be connected to the one or more peripheral hardware devices that are not shown in FIG. 1 through different connection interfaces (such as the SPI bus) to perform the data transmission and exchange. Those skilled in the art should be able to implement according to their needs, therefore details will not be reiterated here.

Since the management device 120 is detachably connected to the main board 110, it may lead to concerns about endangering system security when the electronic system 100 is transported or stored, or when the management device 120 is illegally pulled out due to unexpected circumstances. Herein, the disclosure provides a detection circuit and its method of detecting an illegal removal as follows, so as to protect the system security. It should be noted that, in the following embodiments, the BMC 121 that is connected to the security component 122 through the SPI bus is taken as an example for description. However, the security component 122 may also be connected to one or more devices such as the BIOS memory 123 in FIG. 1 through the SPI bus, and the disclosure is not limited thereto.

Figure 2:
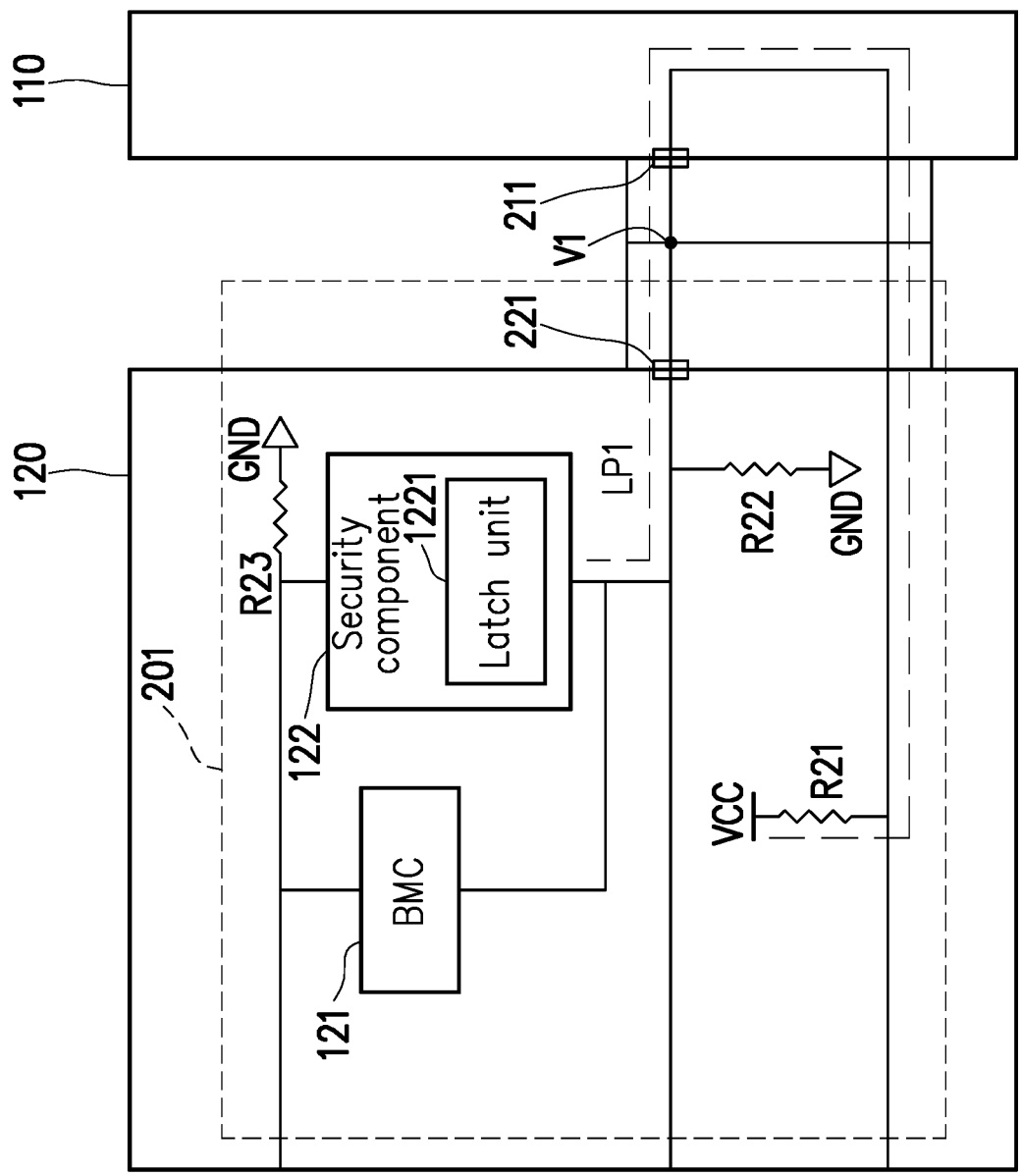
FIG. 2 is a schematic diagram of a detection action of a loop state between a detection circuit and a main board according to an embodiment of the disclosure.

FIG. 2 is a schematic diagram of a detection action of a loop state between a detection circuit and a main board according to an embodiment of the disclosure. In FIG. 2, the electronic system 100 includes the main board 110 and the management device 120. The main board 110 includes the connecting terminal 211. The management device 120 includes a detection circuit 201. The detection circuit 201 includes the connecting terminal 221, and the connecting terminal 221 is detachably coupled to the connecting terminal 211. The security component 122 is configured to detect a loop state between the connecting terminal 221 and the main board 110, and decide whether to lock the SPI bus of the security component 122 according to the loop state. Specifically, the security component 122 may form a loop with the main board 110, and the security component 122 may detect the loop state of the loop. The security component locks the SPI bus of the security component 122 when the loop is being detected by the security component to be disconnected.

In the embodiment, the detection circuit 201 includes a BMC 121, a security component 122, and resistors R21, R22, and R23. The security component 122 includes a latch unit 1221. The latch unit 1221 is coupled to a SPI bus coupled to the connecting terminal 221. The resistor R21 is coupled to a power source voltage VCC. The resistor R22 is coupled between a reference voltage GND, the BMC 121 and the security component 122. The resistor R23 is then coupled between the reference voltage GND, the BMC 121 and the security component 122.

With reference to FIG. 2, a voltage V1 may be generated on the connecting terminal 211 and the connecting terminal 221, and a loop LP1 is formed when the connecting terminal 211 is electrically connected to the connecting terminal 221 of the main board 110. The resistors R21 and R22 may form a resistor string through the mutual electrical connection between the connecting terminal 211 and the connecting terminal 221, and are configured to divide the power source voltage VCC, so as to generate the voltage V1. At this time, the BMC 121 and the security component 122 may detect a first voltage to be the voltage V1, and enable the BMC 121 and the security component 122 to determine whether the management device 120 is safely plugged into the main board 110 by determining whether the loop LP1 is conductive or disconnected according to the voltage V1. In the embodiment, the security component 122 detects the first voltage to be the voltage V1, and may determine that the loop LP1 is conductive. At the same time, the first voltage is detected by the latch unit 1221 included in the security component 122 to be the voltage V1, therefore the latch unit 1221 remains at a high level that is non-triggered. The processor included in the electronic system 100 may be connected to other devices such as the BMC 121 and the BIOS memory 123 through the SPI bus of the security component 122, and loads firmware to enable the electronic system 100 to start normally.

On the other hand, the resistor R22 is a pull-down resistor when the connecting terminal 211 is disconnected from the connecting terminal 221 unexpectedly, and enables the voltage detected by the BMC 121 and the security component 122 to may be equal to the reference voltage GND. At this time, the BMC 121 and the security component 122 may detect the first voltage to be the reference voltage GND, and may determine that the loop LP1 is disconnected. In this way, the security component 122 locks the SPI bus of the security component 122, and enables the electronic system 100 to enter into a protection mode. At the same time, the security component 122 triggers the included latch unit 1221 to switch from the high level to a low level to lock the SPI bus. In detail, the latch unit 1221 is triggered by the reference voltage GND and remains at the low level when the first voltage received by the latch unit 1221 included in the security component 122 is the reference voltage GND. Even if the connecting terminal 211 and the connecting terminal 221 are connected again, the security component 122 will still lock the SPI bus of the security component 122, and enables the electronic system 100 to be maintained in the protection mode. In the protection mode, the processor included in the electronic system 100 is unable to connect to the other devices such as the BMC 121 and the BIOS memory 123 through the SPI bus of the security component 122 to load the firmware, disabling the electronic system 100 from starting normally.

In another embodiment, the resistor R22 is also a pull-down resistor when the power source voltage VCC is out of power when the connecting terminal 211 is electrically connected to the connecting terminal 221, and enables the voltage detected by the BMC 121 and the security component 122 to may be equal to the reference voltage GND. Similar to the above detection mechanism of the security component 122 when the connecting terminal 211 is disconnected from the connecting terminal 221, the security component 122 will lock the SPI bus of the security component 122, and enables the electronic system 100 to enter into the protection mode.

Figure 3:
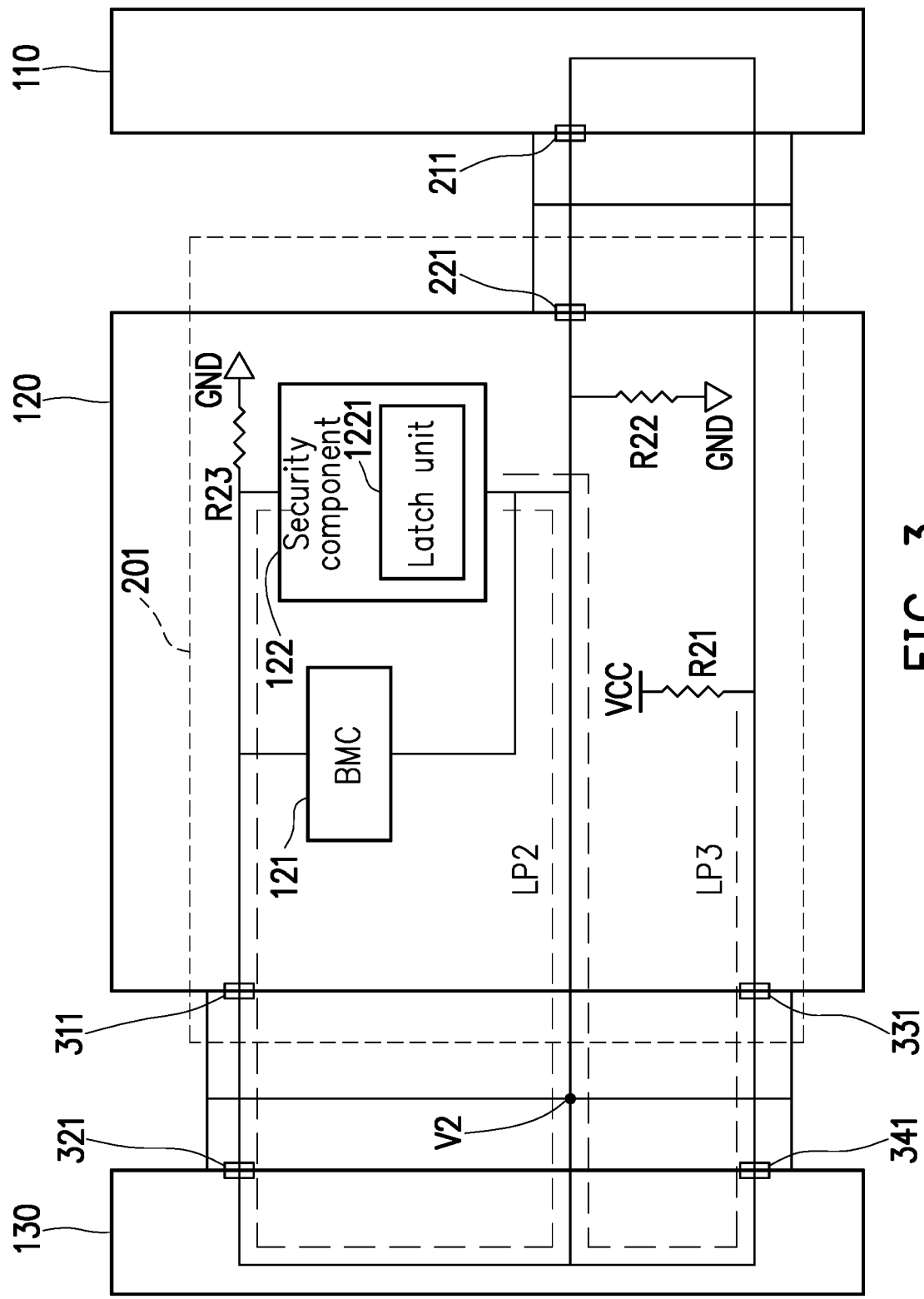
FIG. 3 is a schematic diagram of a detection action of a loop state between the detection circuit, an unlocking component and the main board according to an embodiment of the disclosure.

FIG. 3 is a schematic diagram of a detection action of a loop state between the detection circuit and an unlocking component and the main board according to an embodiment of the disclosure. In FIG. 3, the electronic system 100 includes the main board 110, the management device 120, and an unlocking component 130. The main board 110 includes the connecting terminal 211. The management device 120 includes the detection circuit 201. The detection circuit 201 includes the connecting terminal 221 and an unlocking terminal 311, and the connecting terminal 221 is detachably connected to the connecting terminal 211. The unlocking component 130 includes an unlocking terminal 321, and the unlocking terminal 321 is detachably connected to the unlocking terminal 311. The security component 122 is configured to detect a loop state between the unlocking terminal 311 and the unlocking component 130, and to determine whether to lock the SPI bus of the security component 122 according to the loop status.

The unlocking component 130 provided by the disclosure may be configured to prevent the electronic system 100 from entering into the protection mode, and the unlocking component 130 may also be configured to unlock the protection mode.

In the embodiment, the devices and the components included in the detection circuit 201 have been described in detail in the foregoing embodiments and implementation manners, which will not be reiterated here. With reference to FIG. 3, a voltage V2 is on connected terminals between the unlocking terminal 311 and the unlocking terminal 321, and a loop LP2 is formed when the unlocking terminal 311 is electrically connected to the unlocking terminal 321. The resistors R21 and R23 may form a resistor string through the mutual electrical connection between the unlocking terminal 311 and the unlocking terminal 321, and are configured to divide the power source voltage VCC, so as to generate the voltage V2. At this time, the BMC 121 and the security component 122 may detect a second voltage to be the voltage V2, and enable the BMC 121 and the security component 122 to determine whether the unlocking component 130 is plugged into the management device 120 by determining whether the loop LP2 is conductive or disconnected according to the voltage V2. The security component 122 may determine that the loop LP2 is conductive when it detects the voltage V2, which means that the unlocking component 130 is plugged into the management device 120. At the same time, the latch unit 1221 is triggered to conduct the SPI bus of the security component 122 when the security component 122 detects that the loop LP2 is conductive. Specifically, the security component 122 detects the voltage V2 of the connected terminals to trigger the latch unit 1221 to switch from the low level to the high level, so as to release the SPI bus of the lock security component 122. In the embodiment, after the protection mode is released through the unlocking component 130, the management device 120 may be electrically connected to the main board 110, and the electronic system 100 may load the firmware through the SPI bus of the security component 122, and enables the electronic system 100 to start normally.

On the other hand, the voltage V2 is maintained on the connected terminals of the unlocking terminal 311 and the unlocking terminal 321 when the unlocking terminal 311 is electrically connected to the unlocking terminal 321, and the connecting terminal 211 is disconnected from the connecting terminal 221. At this time, the BMC 121 and the security component 122 may detect the second voltage to be the voltage V2. The second voltage is detected by the latch unit 1221 included in the security component 122 to be the voltage V2, therefore the latch unit 1221 remains at the high level that is non-triggered, so as to prevent the electronic system 100 from entering into the protection mode. In this way, the electronic system 100 may load the firmware through the SPI bus of the security component 122, and enables the electronic system 100 to start normally.

In another embodiment, the electronic system 100 may be prevented from entering into the protection mode by the security component 122. With reference to FIGS. 2 and 3 simultaneously, the detection circuit 201 includes the connecting terminal 221 and a connecting terminal 331, and the connecting terminal 221 is detachably connected to the connecting terminal 211. The unlocking component 130 includes a connecting terminal 341, and the connecting terminal 341 is detachably connected to the connecting terminal 331 to form a loop. The security component 122 is configured to detect a loop state between the unlocking terminal 331 and the unlocking component 130, and to determine whether to lock the SPI bus of the security component 122 according to the loop state. In FIG. 2, the resistor R22 is a pull-down resistor when the connecting terminal 331 is not electrically connected to the connecting terminal 341 and the connecting terminal 211 is disconnected from the connecting terminal 221, or when the power source voltage VCC is out of power, and enables the voltage detected by the BMC 121 and the security component 122 to be equal to the reference voltage GND. At this time, the BMC 121 and the security component 122 may detect the first voltage to be the reference voltage GND. In this way, the security component 122 locks the SPI bus of the security component 122, and enables the electronic system 100 to enter into the protection mode. At the same time, the latch unit 1221 is triggered to be at the low level by the reference voltage GND when the first voltage received by the latch unit 1221 included in the security component 122 is the reference voltage GND.

Next, with reference to FIG. 3, the loop is formed when the connecting terminal 331 is electrically connected to the connecting terminal 341, and the security component 122 determines whether the loop state is conductive or disconnected according to the second voltage. The resistors R21 and R23 may form a resistor string when the connecting terminal 331 is electrically connected to the connecting terminal 341 and the connecting terminal 211 is disconnected form the connecting terminal 221, and are configured to divide the power source voltage VCC, so as to generate the voltage V2, and enable the BMC 121 and the security component 122 to determine whether the unlocking component 130 is plugged into the management device 120 by determining whether a loop LP3 is conductive or disconnected according to the voltage V2. In the embodiment, the security component 122 detects the second voltage to be the voltage V2, and may determine that the loop state of the loop LP3 is conductive. At this time, the second voltage detected by the latch unit 1221 included in the security component 122 is the voltage V2, therefore the latch unit 1221 is triggered to be at the high level. At the same time, the security component 122 enables the SPI bus to remain unlocked by the security component 122, so as to remain not entering into the protection mode.

In the embodiment, the resistor R22 is also a pull-down resistor when the connecting terminal 331 is disconnected from the connecting terminal 341, when the connecting terminal 331 is electrically connected to the connecting terminal 341 and the connecting terminal 211 is not electrically connected to the connecting terminal 221, and enables the voltage detected by the BMC 121 and the security component 122 to may be equal to the reference voltage GND. Similar to the above detection mechanism of the security component 122 when the connecting terminal 211 is disconnected from the connecting terminal 221, the security component 122 will lock the SPI bus of the security component 122, and enables the electronic system 100 to enter into the protection mode.

The devices and the components such as the above security component 122, the latch unit 1221, and the unlocking component 130 may all be implemented by applying hardware circuits well known to those skilled in the art.

FIG. 4 shows a flowchart of a method of detecting an illegal removal according to an embodiment of the disclosure. With reference to FIG. 4, in Step S402, the power of the electronic system is switched on, and the management device may be started. In Step S404, the detection circuit may determine whether to remove the management device according to the first voltage. Step S406 is executed when the detection circuit determines that the management device has not been removed (No in the Step S404).

In the Step S406, the electronic system may load the firmware through the SPI bus to enable the electronic system to start normally. Specifically, the electronic system may connect to the other devices such as the BMC and the BIOS memory through the SPI bus of the security component, and load the firmware to enable the electronic system to start normally.

Step S408 is executed when the detection circuit determines that the management device is illegally removed (Yes in the Step S404). In the Step S408, the detection circuit may determine whether to connect to the unlocking component according to the second voltage. The Step S406 is executed when the detection circuit determines that the unlocking component is connected (Yes in the Step S408). Step S410 is executed when the detection circuit determines that the unlocking component is not connected (No in the Step S408).

In the Step S410, the detection circuit locks the SPI bus to enable the electronic system to enter into the protection mode after the removal is determined to be illegal. Specifically, in the protection mode, the SPI bus of the security component is locked by the security component, therefore electronic system cannot connect to the other devices such as the BMC and the BIOS memory through the SPI bus of the security component to load the firmware, disabling the electronic system from starting normally.

In summary, the detection circuit and the method of detecting the illegal removal provided by the embodiments of the disclosure may determine whether the management device has been illegally removed through the detection circuit, and enable the system to enter into the protection mode and unable to boot up normally when the management device has been illegally removed. In addition, the disclosure also provides the mechanism to prevent the system from entering into the protection mode through the unlocking component, and the unlocking component further provides the mechanism to unlock the protection mode. Based on this, the concerns with regards to the system security due to the illegal pulling out of the detachable management device can be prevented, and the system security can be effectively maintained and protected.

Although the disclosure has been described with reference to the above-mentioned embodiments, it is not intended to be exhaustive or to limit the disclosure to the precise form or to exemplary embodiments disclosed. It is apparent to one of ordinary skill in the art that modifications to the described embodiments may be made without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A detection circuit, comprising:
   a first connecting terminal, detachably coupled to a main board;
   a Serial Peripheral Interface (SPI) bus, coupled to the first connecting terminal;
   a security component, coupled to the SPI bus, forming a first loop with the main board, and configured to detect a loop state of the first loop, wherein the SPI bus is locked when the security component detects that the first loop is disconnected; and
   an unlocking terminal, configured to be detachably connected to an unlocking component to form a second loop, wherein the SPI bus is conducted when the security component detects that the second loop is conductive.

2. The detection circuit according to claim 1, wherein the security component determines whether the first loop is conductive or disconnected according to a first voltage when the first connecting terminal is electrically connected to the main board to form the first loop.

3. The detection circuit according to claim 2, wherein the security component further comprises:
   a latch unit, coupled to the SPI bus,
   wherein the first loop is disconnected, and the latch unit is triggered to switch from a high level to a low level to lock the SPI bus when the security component detects that the first voltage is a reference voltage.

4. The detection circuit according to claim 3, wherein the latch unit is triggered to conduct the SPI bus when the security component detects that the second loop is conductive.

5. The detection circuit according to claim 4, wherein the security component detects a second voltage of the unlocking terminal to trigger the latch unit to switch from the low level to the high level to unlock the SPI bus when the unlocking terminal is electrically connected to the unlocking component.

6. The detection circuit according to claim 4, further comprising:
   a second connecting terminal, detachably coupled to the unlocking component to form a third loop,
   wherein the security component determines whether a loop state of the third loop is conductive or disconnected according to a second voltage when the second connecting terminal is electrically connected to the unlocking component.

7. The detection circuit according to claim 6, wherein the SPI bus remains unlocked when the first connecting terminal is disconnected from the main board and the loop state of the third loop is conductive.

8. The detection circuit according to claim 6, wherein the security component locks the SPI bus when the second connecting terminal is disconnected from the unlocking component.

9. An electronic system, comprising:
   a main board; and
   a detection circuit, further comprising:
   a first connecting terminal, detachably coupled to the main board;
   a Serial Peripheral Interface (SPI) bus, coupled to the first connecting terminal;

a security component, coupled to the SPI bus, forming a first loop with the main board, and configured to detect a loop state of the first loop, wherein the SPI bus is locked when the security component detects that the first loop is disconnected; and an unlocking terminal, configured to be detachably connected to an unlocking component to form a second loop, wherein the SPI bus is conducted when the security component detects that the second loop is conductive.

10. A method of detecting an illegal removal, which is applicable to a detection circuit having a first connecting terminal, a Serial Peripheral Interface (SPI) bus, and a security component, wherein the first connecting terminal is configured to detachably connect to a main board, wherein the SPI bus is coupled to the first connecting terminal and the security component, the method comprising:

detecting a loop state of a first loop formed by the first connecting terminal and the main board, wherein the SPI bus is locked when the first loop is detected to be disconnected; and conducting the SPI bus when the security component detects that a second loop is conductive, wherein the detection circuit further comprises an unlocking terminal that is configured to be detachably connected to an unlocking component to form the second loop.

11. The method of detecting the illegal removal according to claim 10, further comprising:

determining whether the first loop is conductive or disconnected according to a first voltage when the first connecting terminal is electrically connected to the main board to form the first loop.

12. The method of detecting the illegal removal according to claim 11, wherein the security component further comprises a latch unit that is coupled to the SPI bus, the method further comprising:

disconnecting the first loop and triggering the latch unit to switch from a high level to a low level to lock the SPI bus when the first voltage is detected to be a reference voltage.

13. The method of detecting the illegal removal according to claim 12, the method further comprising:

triggering the latch unit to conduct the SPI bus when the second loop is detected to be conductive.

14. The method of detecting the illegal removal according to claim 13, further comprising:

detecting a second voltage of the unlocking terminal to trigger the latch unit to switch from the low level to the high level to unlock the SPI bus when the unlocking terminal is electrically connected to the unlocking component.

15. The method of detecting the illegal removal according to claim 13, wherein the detection circuit further comprises a second connecting terminal that is detachably coupled to the unlocking component to form a third loop, the method further comprising:

determining whether a loop state of the third loop is conductive or disconnected according to a second voltage when the second connecting terminal is electrically connected to the unlocking component.

16. The method of detecting the illegal removal according to claim 15, further comprising:

enabling the SPI bus to remain unlocked when the first connecting terminal is disconnected from the main board and the loop state of the third loop is conductive.

17. The method of detecting the illegal removal according to claim 15, further comprising:

locking the SPI bus when the second connecting terminal is disconnected from the unlocking component.

* * * * *